(12) United States Patent
Hin et al.

(10) Patent No.: US 11,574,951 B2
(45) Date of Patent: Feb. 7, 2023

(54) FAN-OUT LIGHT-EMITTING DIODE (LED) DEVICE SUBSTRATE WITH EMBEDDED BACKPLANE, LIGHTING SYSTEM AND METHOD OF MANUFACTURE

(71) Applicant: Lumileds LLC, San Jose, CA (US)

(72) Inventors: Tze Yang Hin, Cupertino, CA (US); Qing Xue, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 323 days.

(21) Appl. No.: 16/831,378

(22) Filed: Mar. 26, 2020

(65) Prior Publication Data

US 2020/0312904 A1 Oct. 1, 2020

Related U.S. Application Data

(60) Provisional application No. 62/826,612, filed on Mar. 29, 2019.

(51) Int. Cl.
*H01L 27/15* (2006.01)
*H01L 21/768* (2006.01)
(Continued)

(52) U.S. Cl.
CPC .......... *H01L 27/153* (2013.01); *H01L 21/486* (2013.01); *H01L 21/4853* (2013.01);
(Continued)

(58) Field of Classification Search
CPC combination set(s) only.
See application file for complete search history.

(56) References Cited

U.S. PATENT DOCUMENTS 3,912,650 A 10/1975 Khalid et al.
5,073,814 A 12/1991 Cole, Jr. et al.
(Continued)

FOREIGN PATENT DOCUMENTS

CN 102315208 A 1/2012
EP 3113236 A1 1/2017
(Continued)

OTHER PUBLICATIONS

International Search Report and Written Opinion dated Jun. 29, 2021 for PCT International Application No. PCT/US2021/021702.
(Continued)

*Primary Examiner* — Ratisha Mehta
(74) *Attorney, Agent, or Firm* — Volpe Koenig

(57) ABSTRACT

Panels of LED arrays and LED lighting systems are described. A panel includes a substrate having a top and a bottom surface. Multiple backplanes are embedded in the substrate, each having a top and a bottom surface. Multiple first electrically conductive structures extend at least from the top surface of each of the backplanes to the top surface of the substrate. Each of multiple LED arrays is electrically coupled to at least some of the first conductive structures. Multiple second conductive structures extend from each of the backplanes to at least the bottom surface of the substrate. At least some of the second electrically conductive structures are coupled to at least some of the first electrically conductive structures via the backplane. A thermal conductive structure is in contact with the bottom surface of each of the backplanes and extends to at least the bottom surface of the substrate.

20 Claims, 11 Drawing Sheets

(51) Int. Cl.
  *H01L 21/683* (2006.01)
  *H01L 23/00* (2006.01)
  *H01L 21/78* (2006.01)
  *H01L 21/48* (2006.01)
  *H01L 33/62* (2010.01)
  *H01L 33/64* (2010.01)
  *H01L 21/60* (2006.01)

(52) U.S. Cl.
  CPC .... *H01L 21/6836* (2013.01); *H01L 21/76805* (2013.01); *H01L 21/76877* (2013.01); *H01L 21/78* (2013.01); *H01L 24/81* (2013.01); *H01L 27/156* (2013.01); *H01L 33/62* (2013.01); *H01L 33/642* (2013.01); *H01L 33/647* (2013.01); *H01L 2021/60067* (2013.01); *H01L 2021/60135* (2013.01); *H01L 2224/81815* (2013.01); *H01L 2933/0066* (2013.01)

(56) References Cited

U.S. PATENT DOCUMENTS

| | | | |
|---|---|---|---|
| 5,336,453 | A | 8/1994 | Giller et al. |
| 6,730,391 | B1 | 5/2004 | Saijo et al. |
| 6,936,855 | B1 | 8/2005 | Harrah |
| 7,550,319 | B2 | 6/2009 | Wang et al. |
| 8,513,790 | B2 | 8/2013 | Chen et al. |
| 8,536,714 | B2 | 9/2013 | Sakaguchi |
| 8,773,006 | B2 | 7/2014 | Kim et al. |
| 9,018,655 | B2 | 4/2015 | Tu et al. |
| 9,615,453 | B2 | 4/2017 | Yang |
| 9,653,397 | B2 | 5/2017 | Kwon et al. |
| 9,899,465 | B2 | 2/2018 | Bower et al. |
| 10,005,384 | B2 | 6/2018 | Canonne et al. |
| 10,205,055 | B2 | 2/2019 | Chu et al. |
| 10,262,977 | B2 | 4/2019 | Henry et al. |
| 10,347,509 | B1 | 7/2019 | Shen |
| 10,420,204 | B2 | 9/2019 | Lin et al. |
| 10,529,690 | B2 | 1/2020 | Shih et al. |
| 10,665,578 | B2 | 5/2020 | Huitema et al. |
| 10,683,986 | B2 | 6/2020 | Lefaudeux et al. |
| 2003/0020156 | A1 | 1/2003 | Farquhar et al. |
| 2003/0136577 | A1 | 7/2003 | Abe |
| 2005/0263867 | A1 | 12/2005 | Kambe et al. |
| 2005/0269287 | A1 | 12/2005 | Tsujimura et al. |
| 2006/0141851 | A1 | 6/2006 | Matsui et al. |
| 2007/0080458 | A1 | 4/2007 | Ogawa et al. |
| 2009/0046432 | A1 | 2/2009 | Hsu |
| 2009/0207630 | A1 | 8/2009 | Satoh et al. |
| 2010/0039817 | A1 | 2/2010 | Wen et al. |
| 2010/0155746 | A1 | 6/2010 | Ibbetson et al. |
| 2011/0030209 | A1 | 2/2011 | Chang et al. |
| 2011/0121347 | A1 | 5/2011 | Liu et al. |
| 2012/0106140 | A1 | 5/2012 | Sun et al. |
| 2012/0175643 | A1 | 7/2012 | West |
| 2012/0188734 | A1 | 7/2012 | Mikado et al. |
| 2012/0273960 | A1 | 11/2012 | Park et al. |
| 2013/0075924 | A1 | 3/2013 | Lin et al. |
| 2013/0193463 | A1 | 8/2013 | Kong et al. |
| 2013/0221452 | A1 | 8/2013 | Strothmann et al. |
| 2013/0328067 | A1 | 12/2013 | Tsou et al. |
| 2014/0021493 | A1 | 1/2014 | Andrews et al. |
| 2014/0061930 | A1 | 3/2014 | Holmes et al. |
| 2014/0124777 | A1 | 5/2014 | Nakatani et al. |
| 2014/0182896 | A1 | 7/2014 | Lee et al. |
| 2014/0251658 | A1 | 9/2014 | Lin et al. |
| 2014/0268780 | A1 | 9/2014 | Wang et al. |
| 2014/0306845 | A1 | 10/2014 | Shiu et al. |
| 2015/0054001 | A1 | 2/2015 | Oganesian et al. |
| 2015/0054406 | A1 | 2/2015 | Gershowitz et al. |
| 2015/0084206 | A1 | 3/2015 | Lin |
| 2015/0200185 | A1* | 7/2015 | Yu ...................... H01L 25/105 257/737 |
| 2015/0303219 | A1 | 10/2015 | Tada |
| 2015/0319868 | A1 | 11/2015 | Wei et al. |
| 2015/0371585 | A1 | 12/2015 | Bower et al. |
| 2016/0050771 | A1 | 2/2016 | Yu et al. |
| 2016/0172402 | A1 | 6/2016 | Katkar |
| 2016/0316565 | A1 | 10/2016 | Chen et al. |
| 2016/0324004 | A1 | 11/2016 | Schwarz et al. |
| 2017/0009978 | A1 | 1/2017 | Hong et al. |
| 2017/0025593 | A1 | 1/2017 | Bower et al. |
| 2017/0033062 | A1 | 2/2017 | Liu et al. |
| 2017/0040306 | A1 | 2/2017 | Kim et al. |
| 2017/0062383 | A1 | 3/2017 | Yee et al. |
| 2017/0140202 | A1 | 5/2017 | Huang et al. |
| 2017/0263546 | A1* | 9/2017 | Lin .................. H01L 23/49866 |
| 2017/0358562 | A1 | 12/2017 | Banna et al. |
| 2018/0116056 | A1* | 4/2018 | Chen .................... H05K 1/0206 |
| 2018/0166373 | A1* | 6/2018 | Lin .................. H01L 23/49833 |
| 2018/0175262 | A1 | 6/2018 | Jansen et al. |
| 2018/0197471 | A1* | 7/2018 | Rotzoll ............... H01L 25/0753 |
| 2018/0226386 | A1 | 8/2018 | Cok |
| 2018/0269188 | A1 | 9/2018 | Yu et al. |
| 2018/0269191 | A1 | 9/2018 | England et al. |
| 2018/0337135 | A1 | 11/2018 | Yoshihiro et al. |
| 2018/0337142 | A1 | 11/2018 | Cheng et al. |
| 2018/0358317 | A1 | 12/2018 | Albers et al. |
| 2019/0006283 | A1 | 1/2019 | Wang et al. |
| 2019/0056067 | A1 | 2/2019 | Price et al. |
| 2019/0066571 | A1 | 2/2019 | Goward |
| 2019/0075656 | A1 | 3/2019 | Kim et al. |
| 2019/0088603 | A1 | 3/2019 | Marimuthu et al. |
| 2019/0096864 | A1 | 3/2019 | Huitema et al. |
| 2019/0181315 | A1 | 6/2019 | Liao et al. |
| 2019/0206833 | A1 | 7/2019 | Meyer et al. |
| 2019/0305205 | A1 | 10/2019 | Feichtinger |
| 2019/0319020 | A1 | 10/2019 | Pan |
| 2019/0333444 | A1 | 10/2019 | He et al. |
| 2019/0360673 | A1 | 11/2019 | Seo |
| 2019/0385513 | A1 | 12/2019 | Iguchi et al. |
| 2020/0105638 | A1 | 4/2020 | Chiang et al. |
| 2020/0119235 | A1 | 4/2020 | Ahmed et al. |
| 2020/0176346 | A1 | 6/2020 | Wu et al. |
| 2020/0251626 | A1 | 8/2020 | Lee et al. |
| 2021/0028766 | A1 | 1/2021 | Hurwitz et al. |
| 2021/0074645 | A1 | 3/2021 | Tsai et al. |
| 2021/0125971 | A1 | 4/2021 | Chu et al. |

FOREIGN PATENT DOCUMENTS

| | | |
|---|---|---|
| EP | 3582593 A1 | 12/2019 |
| JP | 2008-283133 A | 11/2008 |
| JP | 2009-186734 A | 8/2009 |
| JP | 2011-113989 A | 6/2011 |
| KR | 10-2013-0036650 A | 4/2013 |
| TW | 200830975 A | 7/2008 |
| TW | 200942105 A | 10/2009 |
| WO | 2018/116814 A1 | 6/2018 |
| WO | 2018/172152 A1 | 9/2018 |
| WO | 2019/013469 A1 | 1/2019 |
| WO | 2019/168763 A1 | 9/2019 |

OTHER PUBLICATIONS

Extended European Search Report dated Sep. 2, 2020 for European Patent Application No. 20158481.0.
Extended European Search Report dated Jul. 7, 2020 for European Patent Application No. 20157985.1.
Extended European Search Report dated Jul. 30, 2020 for European Patent Application No. 20158288.9.
Extended European Search Report dated Sep. 11, 2020 for European Patent Application No. 20166601.3.
Extended European Search Report dated Oct. 19, 2020 for the European Patent Application No. 20169027.8.
International Search Report and Written Opinion dated Apr. 8, 2021 for PCT International Application No. PCT/US2021/012425.
International Search Report and Written Opinion dated Apr. 16, 2021 for PCT International Application No. PCT/US2020/066998.
International Search Report and Written Opinion dated Apr. 28, 2021 for PCT International Application No. PCT/US2020/061201.

(56) References Cited

OTHER PUBLICATIONS

International Search Report and Written Opinion dated Feb. 11, 2021 for PCT International Application No. PCT/US2020/061205.
International Search Report and Written Opinion dated Feb. 17, 2021 for PCT International Application No. PCT/US2020/061206.
Annex to Form PCT/ISA/206, Communication Relating to the Results of the Partial International Search dated Mar. 4, 2021 for PCT International Application No. PCT/US2020/061201.
U.S. Appl. No. 62/826,612, filed Mar. 29, 2019.
U.S. Appl. No. 16/814,024, filed Mar. 10, 2020.
U.S. Appl. No. 16/750,809, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,824, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,839, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/809,104, filed Mar. 4, 2020, which claims the benefit of U.S. Appl. No. 62/958,058, filed Jan. 7, 2020.

\* cited by examiner

FAN-OUT LIGHT-EMITTING DIODE (LED) DEVICE SUBSTRATE WITH EMBEDDED BACKPLANE, LIGHTING SYSTEM AND METHOD OF MANUFACTURE

CROSS REFERENCE TO RELATED APPLICATIONS

This application claims the benefit of U.S. Provisional Application No. 62/826,612, filed on Mar. 29, 2019, which is incorporated by reference as if fully set forth.

BACKGROUND

Precision control lighting applications may require production and manufacturing of small light-emitting diode (LED) lighting systems. The smaller size of such systems may require unconventional components and manufacturing processes.

SUMMARY

Panels of LED arrays and LED lighting systems are described. A panel includes a substrate having a top and a bottom surface. Multiple backplanes are embedded in the substrate, each having a top and a bottom surface. Multiple first electrically conductive structures extend at least from the top surface of each of the backplanes to the top surface of the substrate. Each of multiple LED arrays is electrically coupled to at least some of the first conductive structures. Multiple second conductive structures extend from each of the backplanes to at least the bottom surface of the substrate. At least some of the second electrically conductive structures are coupled to at least some of the first electrically conductive structures via the backplane. A thermal conductive structure is in contact with the bottom surface of each of the backplanes and extends to at least the bottom surface of the substrate.

BRIEF DESCRIPTION OF THE DRAWINGS

A more detailed understanding can be had from the following description, given by way of example in conjunction with the accompanying drawing wherein.

DETAILED DESCRIPTION OF THE PREFERRED EMBODIMENTS

Figure 1:
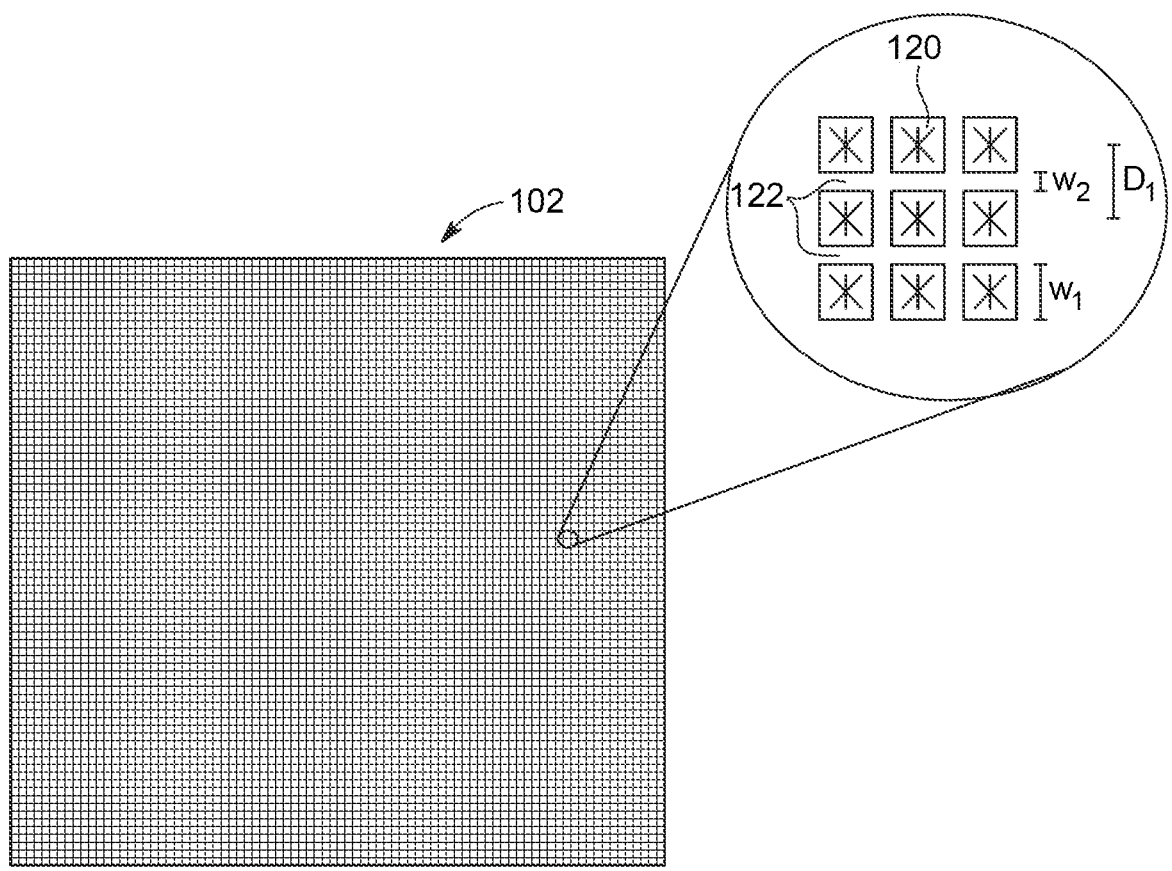
FIG. 1 is a top view of an example LED array.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

FIG. 1 is a top view of an example LED array 102. In the example illustrated in FIG. 1, the LED array 102 is an array of emitters 120. LED arrays may be used for any application, such as those requiring precision control of LED array emitters. Emitters 120 in the LED array 102 may be individually addressable or may be addressable in groups/subsets.

An exploded view of a 3×3 portion of the LED array 102 is also shown in FIG. 1. As shown in the 3×3 portion exploded view, the LED array 102 may include emitters 120 that each have a width $w_1$. In embodiments, the width $w_1$ may be approximately 100 μm or less (e.g., 30 μm). Lanes 122 between the emitters 120 may be a width, $w_2$, wide. In embodiments, the width $w_2$ may be approximately 20 μm or less (e.g., 5 μm). The lanes 122 may provide an air gap between adjacent emitters or may contain other material. A distance $d_1$ from the center of one emitter 120 to the center of an adjacent emitter 120 may be approximately 120 μm or less (e.g., 30 μm). It will be understood that the widths and distances provided herein are examples only and that actual widths and/or dimensions may vary.

It will be understood that, although rectangular emitters arranged in a symmetric matrix are shown in FIG. 1, emitters of any shape and arrangement may be applied to the embodiments described herein. For example, the LED array 102 of FIG. 1 may include over 20,000 emitters in any applicable arrangement, such as a 20×100 matrix, a symmetric matrix, a non-symmetric matrix, or the like. It will also be understood that multiple sets of emitters, matrixes, and/or boards may be arranged in any format to implement the embodiments described herein.

As mentioned above, LED arrays, such as the LED array 102, may include emitters that have fine pitch and line spacing. An LED array such as this may be referred to as a micro LED array or simply a micro LED. A micro LED may include an array of individual emitters provided on a substrate or may be a single silicon wafer or die divided into segments that form the emitters. The latter type of micro LED may be referred to as a monolithic LED. Such arrays may pose challenges for making reliable interconnections between individual LEDs or emitters and a circuit board and/or other components in an LED lighting system, particularly where each LED or emitter is separately addressable. Additionally, such arrays may require significant power to power them, such as 60 watts or more, and, therefore, may emit significant heat during operation. Accordingly, for such arrays, a structure is needed that can accommodate the fine line space and individual addressability of the finely spaced emitters and provide sufficient heat dissipation.

Embodiments described herein may provide for LED lighting systems, panels including a plurality of LED arrays and methods of manufacture for LED arrays with a fine line space and may provide sufficient heat dissipation to meet the requirements of such an LED array. Such LED arrays and LED lighting systems may be used in various applications, including, for example, camera flash applications.

Figure 2:
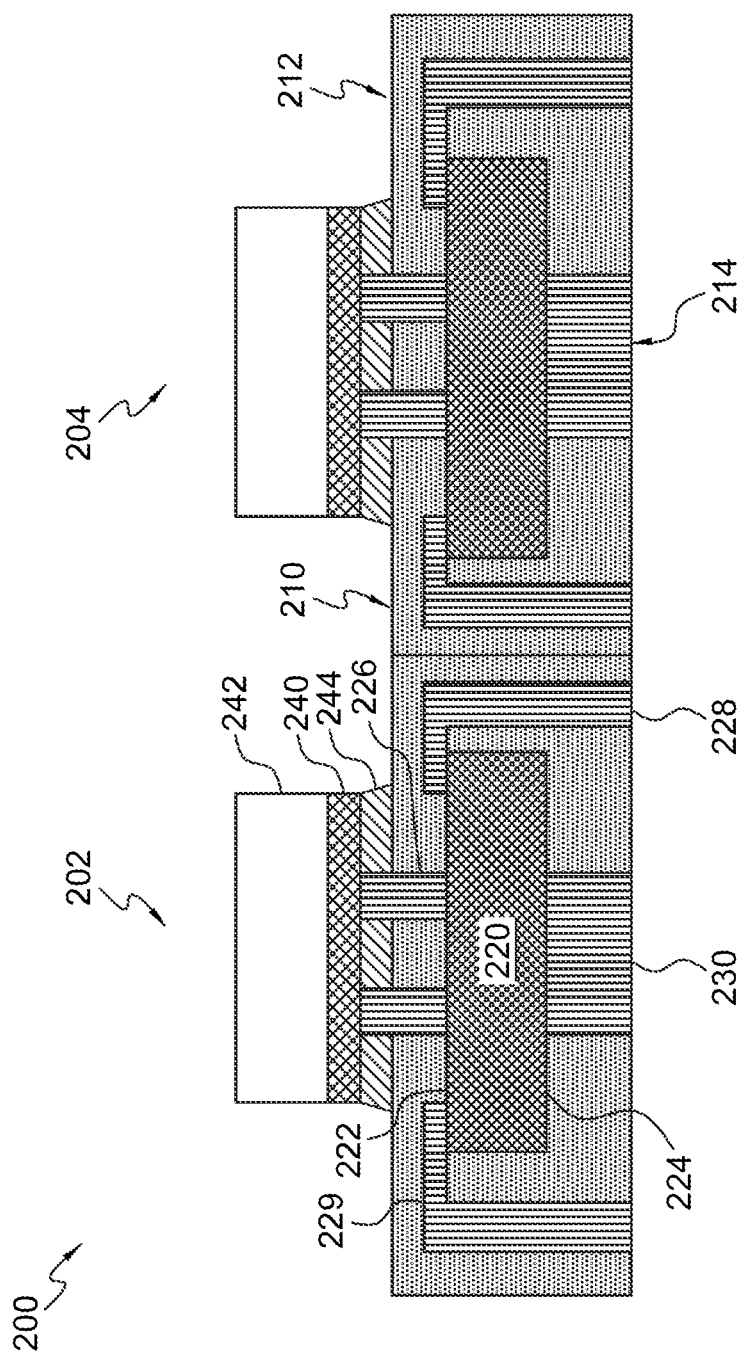
FIG. 2 is a cross-sectional view of an example panel including multiple LED arrays.

FIG. 2 is a cross-sectional view of an example panel 200 including multiple LED arrays. In the example illustrated in FIG. 2, the panel 200 includes a substrate 212 and two LED array assemblies 202 and 204. The substrate 212 may have a top surface 210 and a bottom surface 214 and may be formed from any suitable circuit board material, such as an organic material. In embodiments, the substrate 212 may be formed from a number of different materials, such as a core material, laminate materials, dielectrics, solder masks and conductive materials. Each of the two LED array assemblies 202 and 204 may include a backplane 220 embedded in the substrate 212, multiple first conductive structures 226, multiple second conductive structures 228, 229, a thermal conductor 230, an LED array 240, an underfill material 244 and wavelength converting structure 242. The backplane 220 may have a top surface 222 and a bottom surface 224. The LED array 240 may be a micro LED, such as described above with respect to FIG. 1.

In embodiments, for each of the LED array assemblies 202 and 204, the first conductive structures 226 extend from the top surface of the backplane 220 through the substrate 212 and extend above the top surface 210 of the substrate 212. In some embodiments, the first conductive structures 226 may not extend above the top surface 210 of the substrate 212 but may stop at or below the top surface 210 of the substrate 212. In some embodiments, the first conductive structures 226 may include a combination of different conductive structures. For example, the first conductive structures 226 may include conductive vias that extend between the backplane 220 and the top surface 210 of the substrate 212. Conductive pillars may be disposed on and electrically coupled to the conductive vias (e.g., via metal pads on top of the conductive vias). Solder bumps may be formed on the pillars, which may be reflowed and each coupled to an LED or emitter in an LED array. In some embodiments, a subset of the first conductive structures 216 may be electrically coupled to the LED array. While two first conductive structures 226 are shown coupled to each backplane 220 in FIG. 2, an array of first conductive structures 226 may be coupled to each backplane 220 and may have similar line spacing to the corresponding LED array 224.

Although not shown in FIG. 2, each of the LED arrays 240 may be electrically coupled to corresponding second conductive structures 228, 229, such as by electrical connections between the first conductive structures 226 and the second conductive structures 228, 229 via surface traces, vias or other metallization in or on the backplane 220 as will be understood to one of ordinary skill in the art. This may enable individual LEDs or emitters in the LED arrays 240 to be individually driven by a driver and/or other circuitry when the panel 200 is diced into individual LED array assemblies 202 and 204 and mounted on a circuit board or otherwise electrically coupled to another external assembly. In embodiments, the backplane 220 may be an interposer substrate, which may be formed from a non-organic material. In embodiments, the backplane 220 may be fully embedded in the substrate 212 such that the substrate 212 completely surrounds the backplane 220 on all sides. The backplane 220 may be formed from any of a number of different materials, including, for example organic, inorganic, silicon or glass materials.

In the example shown in FIG. 2, the second electrical conductors 228, 229 provide an electrical connection between the top surface 222 of the backplane 220 and the bottom surface 214 of the substrate 210. The electrically conductive structures 228 may, for example, be conductive vias in the substrate 210. In some embodiments, the electrically conductive structures 228 may be microvias, wires, metal pillars, solder columns, or other electrically conductive structures. The electrically conductive structures 229 may, for example, be electrical traces that extend horizontally from the backplane 220 to the electrically conductive structures 228 and provide an electrical connection therebetween. As will be understood, various types and arrangements of electrical traces may be used, including, for example, fan-in, fan-out, linear and curved horizontal layouts. The electrically conductive structures 228, 229 may be formed from a variety of electrically conductive materials, including, for example, metals, such as copper, silver, aluminum, gold, or metal alloys, or conductive polymeric compositions, graphene, or conductive ceramics.

The thermal conductor 230 may be a structure of any type of thermal material with good heat transfer properties, such as copper, aluminum, or other metal material. The thermal conductor 230 may be a metal slug or other rigid heat transfer plate. The thermal conductor 230 may be disposed in a cavity in the bottom surface 214 of the substrate 210 and be thermally coupled to the backplane 220. In the example illustrated in FIG. 2, the thermal conductor 230 has a top surface in contact with the backplane 220 and a bottom surface that is co-planar with the bottom surface 214 of the substrate 212. In embodiments, however, the bottom surface of the thermal conductor 230 may be substantially co-planar, recessed with respect to the bottom surface 214 of the substrate 212 or extend below the bottom surface 214 of the substrate 212. When the panel 200 is diced, and an individual LED array assembly 202 or 204 is mounted on a circuit board, the thermal conductor 230 may be coupled to a corresponding thermal plate or other heat sink device or material, which may provide for the amount of heat dissipation needed for an LED array, such as described above with respect to FIG. 1.

A wavelength converting structure 242 may be disposed over each of the LED arrays 240. In embodiments, the wavelength converting structure 242 may be a phosphor material, such as a molded or ceramic material containing at least one phosphor material or quantum dots or dyes. The wavelength converting structure 242 may be any suitable thickness to provide desired wavelength converting properties using a selected wavelength converting material. An LED array, combined with one or more wavelength converting materials, may create white light or monochromatic light of other colors when in an ON state. All, or only a portion of, light emitted by the LED in the ON state may be converted by the wavelength converting structure 242. Unconverted light may be part of the final spectrum of light emitted from the LED array assembly 202, 204, though it need not be. By way of example, an LED array assembly 202, 204 with a wavelength converting structure 242 may be or include blue-emitting LEDs or emitters combined with a yellow-emitting phosphor material or green-emitting and red-emitting phosphor materials. By way of another example, the LED array assembly 202, 204 with a wavelength converting structure 242 may be or include UV-emitting LEDs or emitters combined with blue-emitting and yellow-emitting phosphor materials or blue-emitting, green-emitting and red-emitting phosphor materials.

The underfill material 244 may provide protection for otherwise exposed electrical and/or electronic components and conductive elements and/or provide or assist with mechanical coupling of the LED array 244 to the top surface 210 of the substrate 212. In embodiments, the underfill material may be a polymeric binder and may surround portions of the first conductive structures 226 that project above the top surface 212 of the substrate 210.

LED array assemblies, such as the LED array assembly 202, 204 of FIG. 2 may include additional elements (not shown), such as light absorbers, reflectors, other optical coatings, or electrically insulating material. In embodiments, an LED array assembly may include an optically and electrically insulating material, such as organic, inorganic or a combination organic/inorganic binder or filler material. For example, adhesives, epoxies, acrylate or nitrocellulose may be used in conjunction with ceramic particles to provide the underfill 244. Another organic/inorganic binder, filler or sidewall may be, for example, an epoxy with embedded reflective titanium oxide or other reflective scattering particles. Inorganic binders may include sol-gel (e.g., a sol-gel of TEOS or MTMS) or liquid glass (e.g., sodium silicate or potassium silicate), also known as water glass. In embodiments, binders may include fillers that adjust physical properties. Fillers may include inorganic nanoparticles, silica, glass particles or fibers or other materials capable of improving optical or thermal performance.

In embodiments, microlenses or other primary or secondary optical elements, such as reflectors, scattering elements or absorbers, may be coupled or positioned with respect to each LED or emitter or associated wavelength converting structure. Additionally or alternatively, a primary optic may be positioned over the entire LED array, which may be directly attached or mounted at a distance from the LED array in suitable packaging. Protective layers, transparent layers, thermal layers or other packaging structures may be used, as needed, for specific applications.

Figure 3:
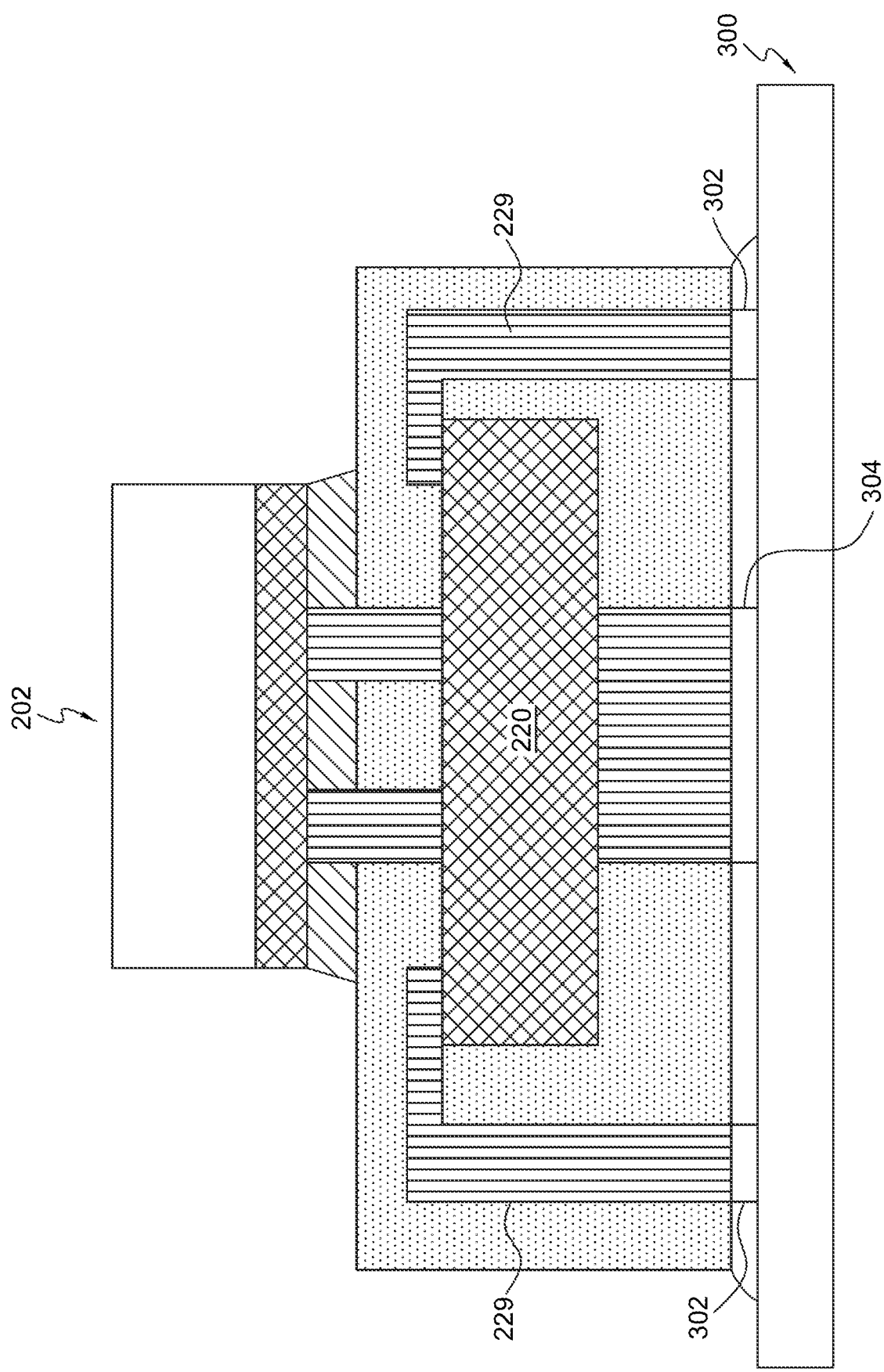
FIG. 3 is a cross-sectional view of an example LED lighting system including a singulated LED array assembly coupled to a circuit board.

FIG. 3 is a cross-sectional view of an example LED lighting system including a singulated LED array assembly 202 coupled to a circuit board 300. In the example illustrated in FIG. 3, the bottom surface 214 of the substrate 212 is placed adjacent a top surface of the circuit board 300. The circuit board may have a number of conductive pads 302. In the example illustrated in FIG. 3, the conductive pads 302 on the circuit board 300 are soldered or otherwise electrically coupled to the second conductive structures 229. The thermally conductive structure 230 in the substrate 212 may also be soldered, placed in contact with or otherwise thermally coupled to a thermally conductive pad 304 on the circuit board. The direct contact and/or bond between the thermally conductive structure 230 and the circuit board 300 enables efficient heat transfer from the LED assembly 202 to the circuit board 300 for heat sinking purposes without need for additional heat dissipating structures over the top of the LED lighting system (or elsewhere) that may, for example, otherwise block light emission from the LED array 240. The circuit board 300 may be part of a larger system used in specific applications (examples are described below with respect to FIGS. 4, 5 and 6). Since the second conductive structures 229 are electrically coupled with the first conductive structures 226, the LED array 202 may be electrically coupled to the circuit board 300 for powering, driving or otherwise controlling optical emission from the LED array 202 via circuitry on the circuit board 300.

As mentioned above, LED arrays, such as the LED arrays 202, 204, may be addressable assemblies and may support applications that benefit from fine-grained intensity, spatial, and temporal control of light distribution. This may include, but not be limited to, precise spatial patterning of emitted light from pixel blocks or individual pixels. Depending on the application, emitted light may be spectrally distinct, adaptive over time, and/or environmentally responsive. The LED arrays may provide pre-programmed light distribution in various intensity, spatial or temporal patterns. The emitted light may be based at least in part on received sensor data and may be used for optical wireless communications. Associated optics may be distinct in a pixel, pixel block, or device level. An example LED array may include a device having a commonly controlled central block of high density pixels with an associated common optic, whereas edge pixels may have individual optics. Common applications supported by LED arrays may include camera flashes, automotive headlights, architectural and area illumination, street lighting, and informational displays.

Figure 4:
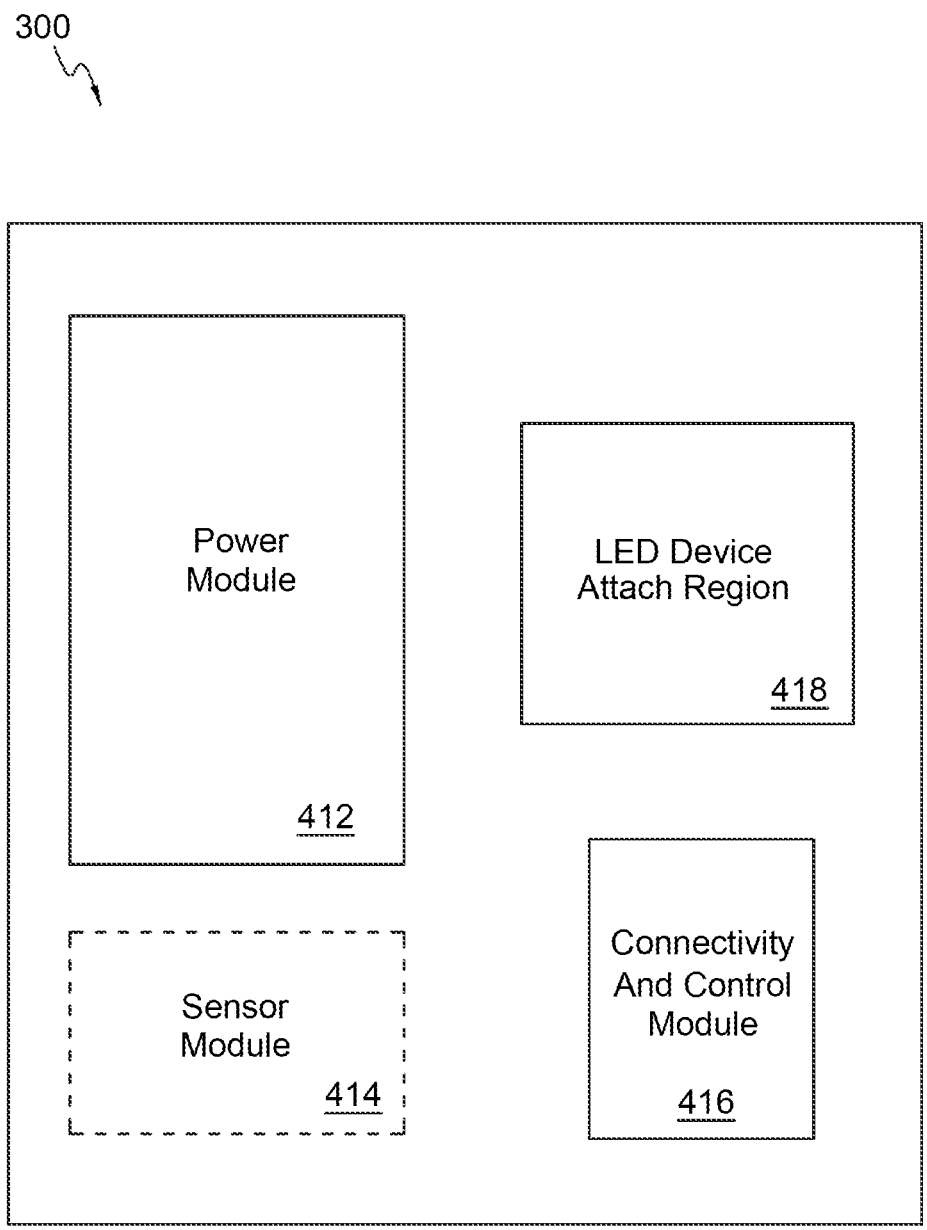
FIG. 4 is a block diagram of an example circuit board to which an LED lighting system may be attached.

FIG. 4 is a top view of an example circuit board 300 that includes an LED device attachment region 418 for attachment of an LED array assembly, such as LED array assemblies 202, 204. In the example illustrated in FIG. 4, the circuit board 300 includes a power module 412, a sensor module 414, and a connectivity and control module 418 on a substrate.

The sensor module 414 may include sensors needed for an application in which the LED array is to be implemented. Example sensors may include optical sensors (e.g., IR sensors and image sensors), motion sensors, thermal sensors, mechanical sensors, proximity sensors, or even timers. By way of example, LEDs in street lighting, general illumination, and horticultural lighting applications may be turned off/on and/or adjusted based on a number of different sensor inputs, such as a detected presence of a user, detected ambient lighting conditions, detected weather conditions, or based on time of day/night. This may include, for example, adjusting the intensity of light output, the shape of light output, the color of light output, and/or turning the lights on or off to conserve energy. For AR/VR applications, motion sensors may be used to detect user movement. The motion sensors themselves may be LEDs, such as IR detector LEDs. By way of another example, for camera flash applications, image and/or other optical sensors or pixels may be used to measure lighting for a scene to be captured so that the flash lighting color, intensity illumination pattern, and/or shape may be optimally calibrated. In alternative embodiments, the circuit board 300 does not include a sensor module.

The connectivity and control module 416 may include the system microcontroller and any type of wired or wireless module configured to receive a control input from an external device. By way of example, a wireless module may include blue tooth, Zigbee, Z-wave, mesh, WiFi, near field communication (NFC) and/or peer to peer modules. The microcontroller may be any type of special purpose computer or processor that may be embedded in an LED lighting system and configured or configurable to receive inputs from the wired or wireless module or other modules, devices or systems in the LED lighting system (such as sensor data and data fed back from an LED array attached at the LED device attach region 418) and provide control signals to other modules based thereon. Algorithms implemented by the special purpose processor may be implemented in a computer program, software, or firmware incorporated in a non-transitory computer-readable storage medium for execution by the special purpose processor. Examples of non-transitory computer-readable storage mediums include a read only memory (ROM), a random access memory (RAM), a register, cache memory, and semiconductor memory devices. The memory may be included as part of the microcontroller or may be implemented elsewhere, either on or off the circuit board 300.

The term module, as used herein, may refer to electrical and/or electronic components disposed on individual circuit boards that may be soldered to one or more circuit boards 300. The term module may, however, also refer to electrical and/or electronic components that provide similar functionality, but which may be individually soldered to one or more circuit boards in a same region or in different regions. While the circuit board 300 is illustrated in FIG. 4 as having certain modules, these are for illustration and example only. One of ordinary skill in the art will recognize that a circuit board may include any number and variety of different modules depending on the application.

Figure 5:
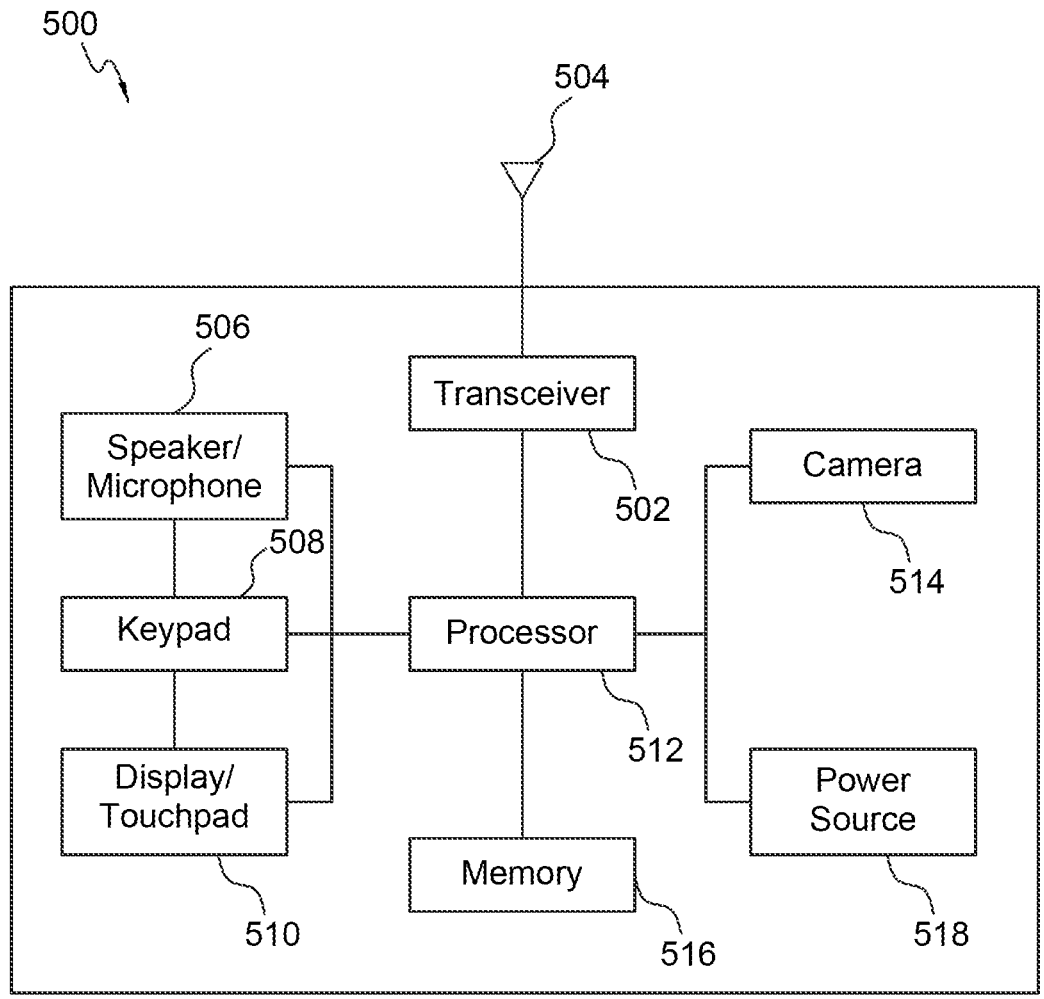
FIG. 5 is a block diagram of an example wireless device in which an LED lighting system may be incorporated.
Figure 6:
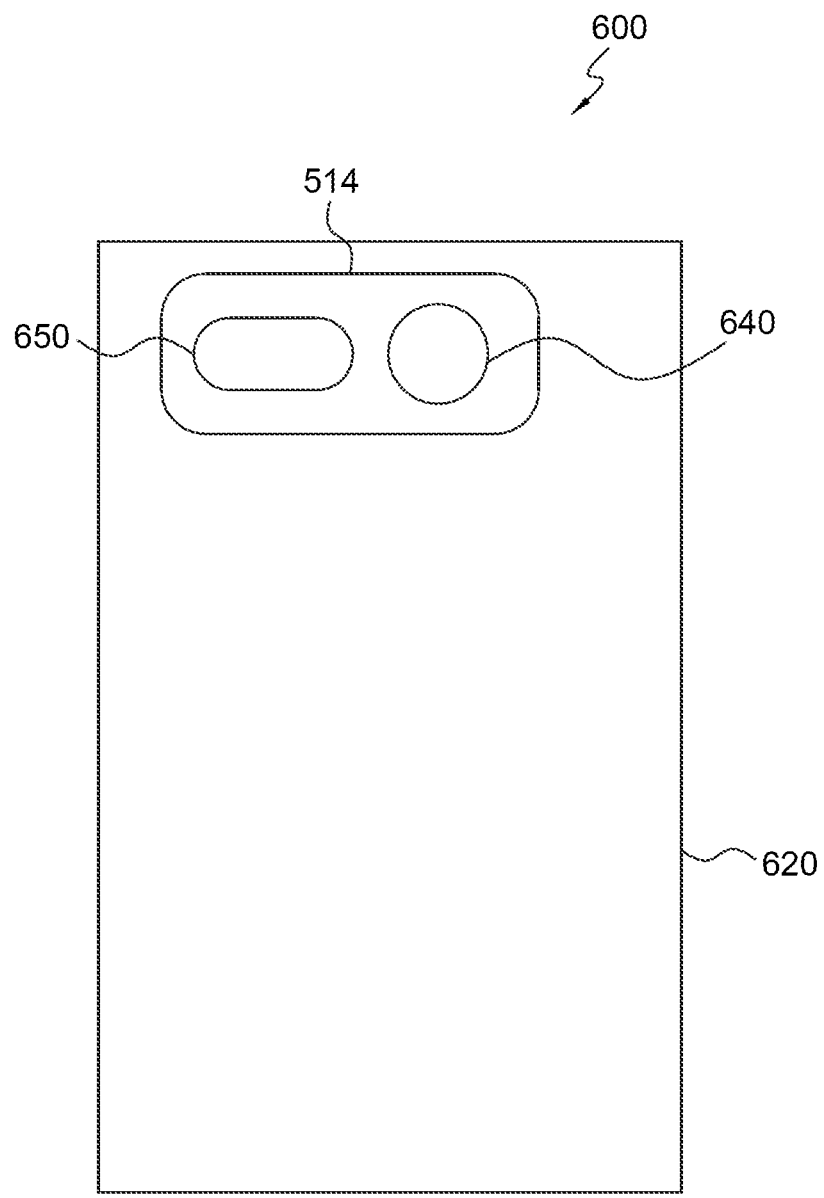
FIG. 6 is a back view of an example wireless device.

As mentioned above, an LED lighting system, such as illustrated in FIG. 3, may be used in a number of different applications, and may be particularly useful in flash applications where closely packed LED arrays and/or individually addressable LED devices or emitters may be desirable. FIGS. 5 and 6 are diagrams of example application systems that may incorporate LED lighting systems, such as the LED lighting system 300 of FIG. 3. The examples illustrated in FIGS. 5 and 6 are for an LED flash application, although one of ordinary skill in the art will understand that LED array assemblies, such as described herein, may be used for many different applications.

An LED array may be well suited for camera flash applications for mobile devices. Typically, an intense brief flash of light from a high intensity LED may be used to support image capture. Unfortunately, with conventional LED flashes, much of the light is wasted on illumination of areas that are already well lit or that do not otherwise need to be illuminated. Use of a light emitting pixel array may provide controlled illumination of portions of a scene for a determined amount of time. This may allow the camera flash to, for example, illuminate only those areas imaged during rolling shutter capture, provide even lighting that minimizes signal to noise ratios across a captured image and minimizes shadows on or across a person or target subject, and/or provide high contrast lighting that accentuates shadows. If emitters of the LED array are spectrally distinct, color temperature of the flash lighting may be dynamically adjusted to provide wanted color tones or warmth.

FIG. 5 is a diagram of an example wireless device 500. In the example illustrated in FIG. 5, the wireless device 500 includes a processor 512, a transceiver 502, an antenna 504, a speaker/microphone 506, a keypad 508, a display/touchpad 510, a memory 516, a power source 518, and a camera 514.

The processor 512 may be a general purpose processor, a special purpose processor, a conventional processor, a digital signal processor (DSP), a microprocessor, one or more microprocessors in association with a DSP core, a controller, a microcontroller, an application specific integrated circuit (ASIC), a field programmable gate array (FPGA) circuit, an integrated circuit (IC), a state machine, and the like. The processor 512 may be coupled to, and may receive user input data from, the speaker/microphone 506, the keypad 508, the display/touchpad 510 and/or the camera 514. The processor 512 may also output user data to the speaker/microphone 506, the keypad 508, the display/touchpad 510 and/or the camera 514. In addition, the processor 512 may access information from, and store data in, any type of suitable memory, such as the memory 516. The processor 512 may receive power from the power source 518 and may be configured to distribute and/or control the power to the other components in the wireless device 500.

The processor 512 may also be coupled to the camera 514. In embodiments, the camera 514 may include, for example, an image sensor, read out circuitry, a flash module and/or any other required circuitry or controls required to operate the camera 514. In embodiments, the flash module may include an LED lighting system, such as the LED lighting system 300 of FIG. 3, and a driver, one or more sensors and/or any other circuitry or controls required to operate the flash.

FIG. 6 is a back view of a wireless device 600 showing more detail of the camera 514. In the example illustrated in FIG. 6, the wireless device 600 includes a casing 620 and a camera 514. The camera 514 includes a lens 640 via which the camera's image sensor (not shown in FIG. 6) may capture an image of a scene. The camera module 514 may also include a flash 650 that may include one or more LED arrays, which may be a part of one or more LED lighting systems, such the LED lighting system 300 of FIG. 3.

Figure 7:
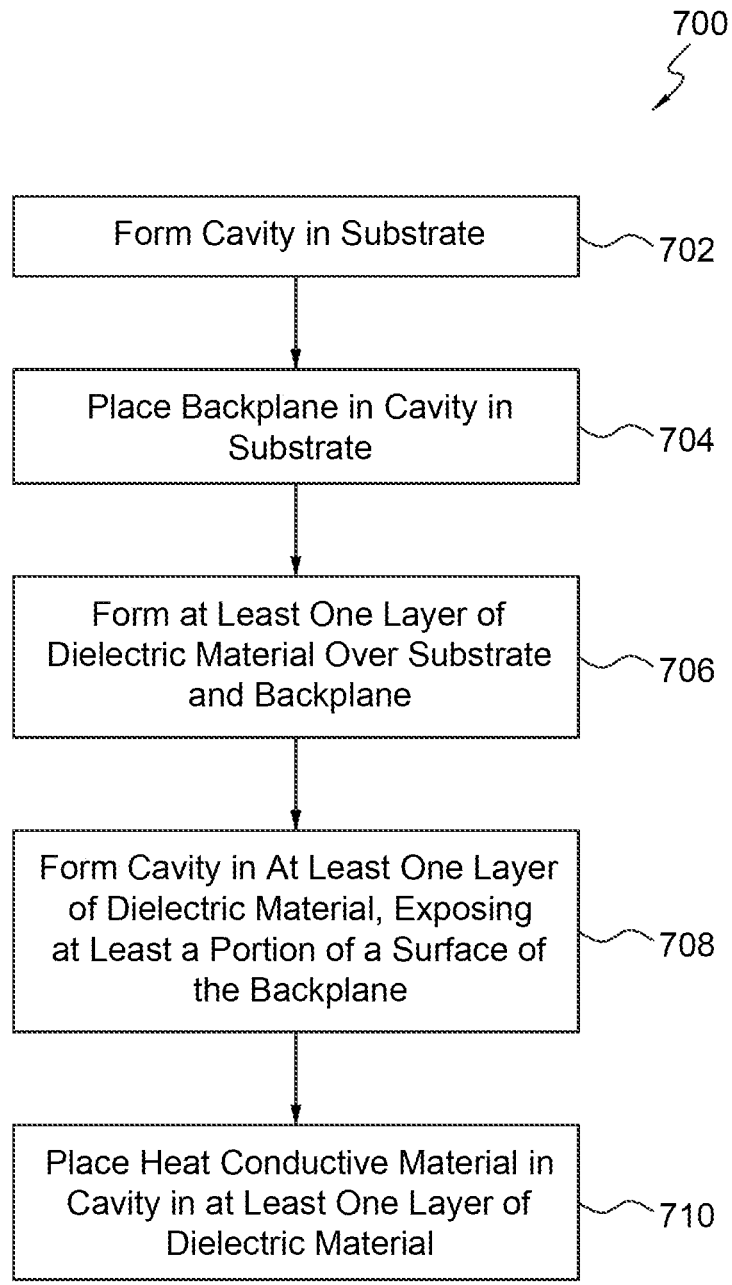
FIG. 7 is a flow diagram of an example method of manufacturing an LED lighting system, such as the LED lighting system of FIG. 2.

FIG. 7 is a flow diagram of an example method 700 of manufacturing a panel of LED arrays and/or an LED lighting system, such as the panel 200 of FIG. 2 and/or the LED lighting system 300 of FIG. 3. FIGS. 8A, 8B, 8C, 8D, 8E, 8F, 8G, 8H, 8I, 8J and 8K are cross sectional views of a panel of LED arrays at various stages in the manufacturing method.

Figure 8A:
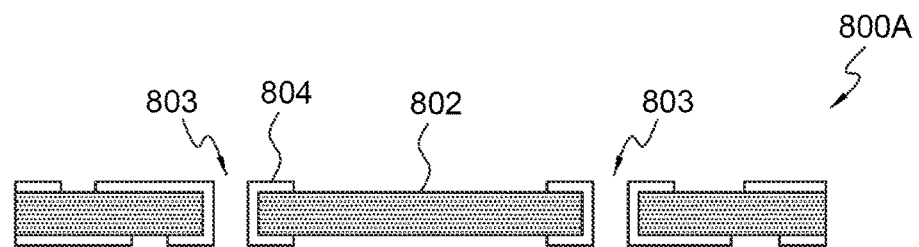
FIGS. 8A, 8B, 8C, 8D, 8E, 8F, 8G, 8H, 8I, 8J and 8K are cross sectional views of the LED lighting system at various stages in the manufacturing process.
Figure 8B:
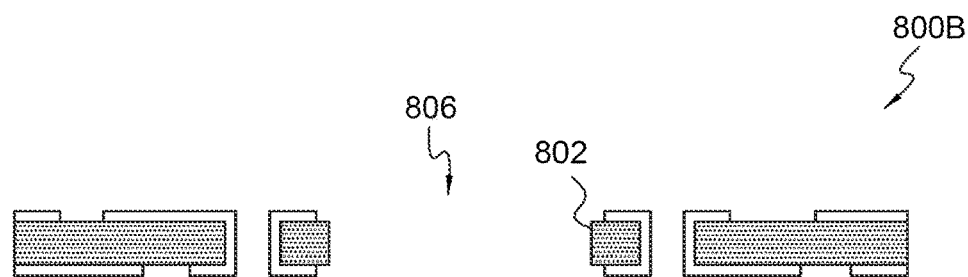

In the example method 700 illustrated in FIG. 7, a cavity is formed in a substrate (702). FIG. 8A is a cross-sectional view 800A of the substrate 802. The substrate 802 has vias 803 formed therein and metallization 804 formed over portions of the top and bottom surfaces of the substrate 802 and in the vias 803. The metallization 804 form at least portions of the second conductive structures 228, 229 of FIG. 2. FIG. 8B is a cross-sectional view 800B of the substrate 802 with a cavity 806 formed therein. While the opening is shown in the cross-sectional view as completely separating the substrate 806 into two pieces, the cavity may be formed partially through the substrate or may be a via or other opening formed completely through the substrate but surrounded on all sides by at least a portion of the substrate 802.

Figure 8C:
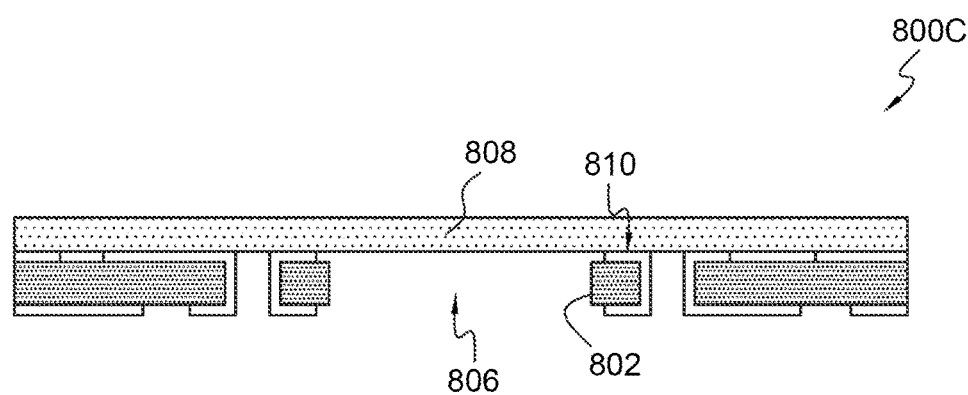
Figure 8D:
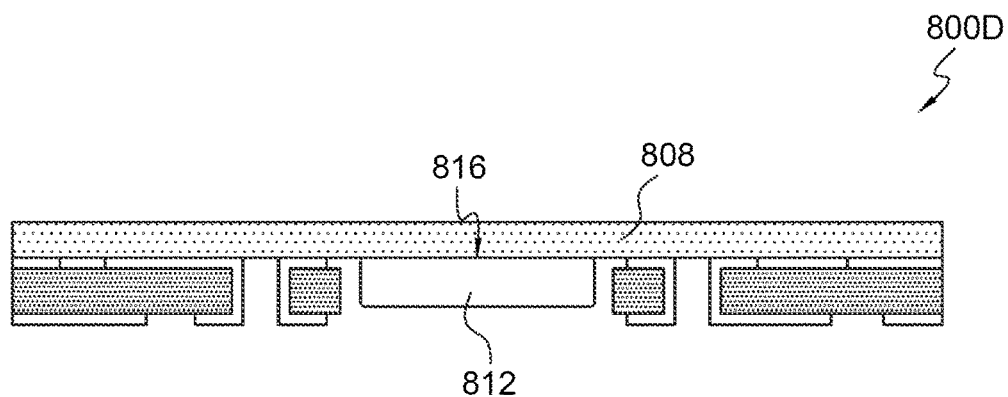

Referring back to FIG. 7, a backplane may be placed in the cavity in the substrate (704). FIGS. 8C and 8D are cross-sectional views 800C and 800D of the substrate at different points in the placing of the backplane. In FIG. 8C, a tape 808 or other temporary structure is placed over the substrate 802 and adhered or otherwise coupled to a top surface 810 of the metallization 804. In FIG. 8D, a backplane 812 is placed in the cavity 806 and adhered or otherwise coupled to the tape or other temporary structure 808.

Figure 8E:
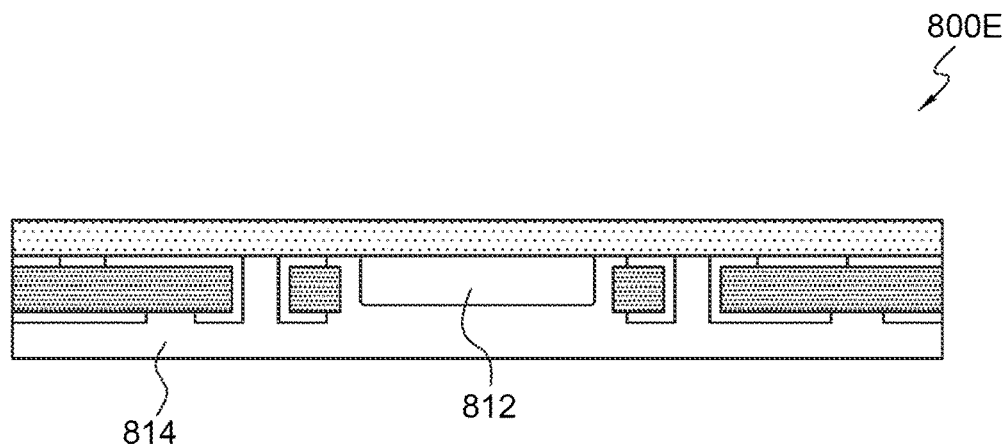
Figure 8F:
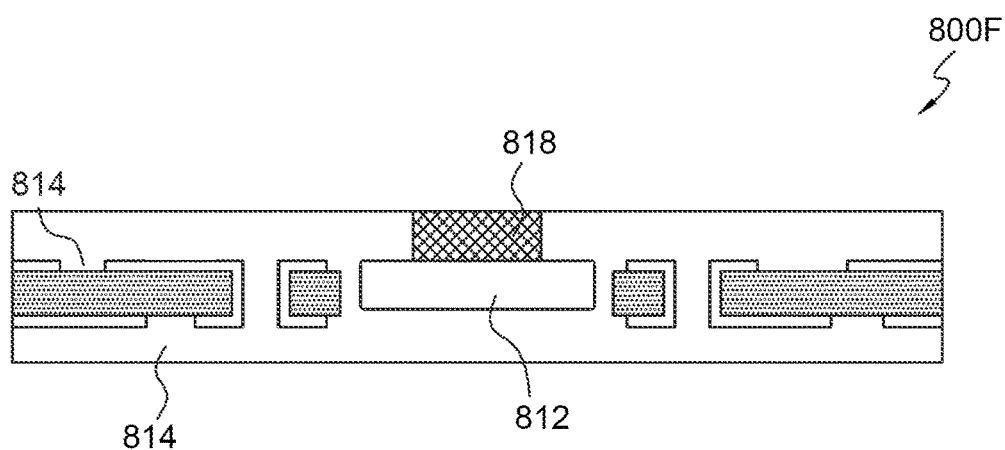

Referring back to FIG. 7, at least one layer of a dielectric material may be formed over the substrate and the backplane (706). FIGS. 8E and 8F are cross-sectional views 800E and 800F of the substrate at various points during the formation of the at least one layer of the dielectric material. FIG. 8E is a cross-sectional view showing dielectric material 814 formed over one side of the backplane 812 and the substrate 802 while the other side of the backplane 812 and the substrate 802 are still on the tape or other temporary structure 808. In the example illustrated in FIG. 8E, the dielectric material 814 also fills all voids and vias within the substrate 802 that are not filled with another material. In FIG. 8F, the tape or other temporary structure 808 is removed, and at least one other layer of the dielectric material 814 is formed on the side of the substrate 802 and the backplane 812 exposed by the removal of the tape of other temporary structure 808. In embodiments, the dielectric material may be a polymer dielectric material, such as polyimide.

The at least one layer of dielectric material 814 may be one or more redistribution layers (RDL). The number of RDL layers may depend on the specific application for which the LED array panel is being implemented. Relative to the panel 200 of FIG. 2, the substrate 802, along with at least portions of the dielectric material 814, may form the substrate 212 of FIG. 2 in which the backplane 220 is embedded. In other words, one method of embedding the backplane 220 in the substrate 212 may include forming a cavity in a substrate, such as the substrate 802, and then forming one or more layers of dielectric over the substrate and the backplane such that the backplane is embedded in the substrate along with the at least one layer of dielectric material.

Referring back to FIG. 7, a cavity may be formed in the at least one layer of dielectric material, exposing at least a portion of a surface of the backplane (708). A heat conductive material is placed in the at least one layer of dielectric material (710). Referring back to FIG. 8F, a cavity is formed in the dielectric material 814, and the heat conductive material 818 is placed in the cavity.

Figure 8G:
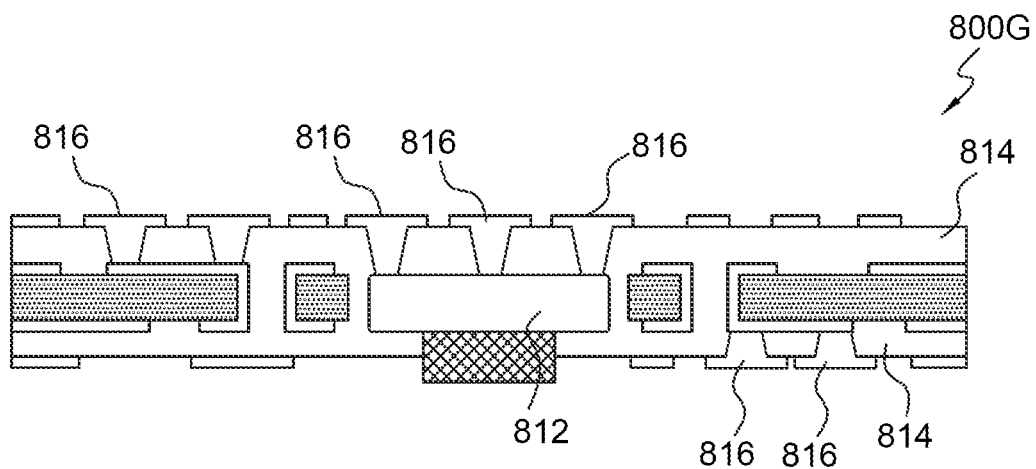

FIG. 8G is a cross-sectional view 800G of the panel. In FIG. 8G, the entire assembly of FIG. 8F has been flipped, and vias have been formed in what is now the top surface of the dielectric material 814 and exposing a surface of the backplane 812. The vias may be filled or lined with a conductive material, and conductive pads 816 may be formed on an outer surface of the dielectric material 814. The vias (and optionally the pads) with the conductive material may form the first conductive structures 226 of FIG. 2, for example. Other vias and optionally conductive pads 816 may be formed in what is now the bottom surface of the dielectric material 814. These may be electrically coupled to the metallization 804 and may be part of the second conductive structures 228, 229 of FIG. 2, which extend to the bottom surface of the substrate 212. Although not shown in FIG. 8G, these portions of the vias/pads 816 formed in the bottom surface of the dielectric material 814 and the metallization 804 may be electrically coupled to the vias/pads 816 formed in the top surface of the dielectric material 814 by traces and/or vias in or on the backplane 812 or by other portions of the metallization 804 or conductive materials lining or filling the vias, as explained above with respect to FIG. 2. This may provide an electrical coupling between the first conductive structures 226 and the second conductive structures 228, 229, as described above. While only three vias/pads 816 are shown extending from the top surface of the backplane 812 in FIG. 8G, there may be an array of closely spaced vias/pads, which may be electrically coupled to individual LED or emitters in the LED array.

Figure 8H:
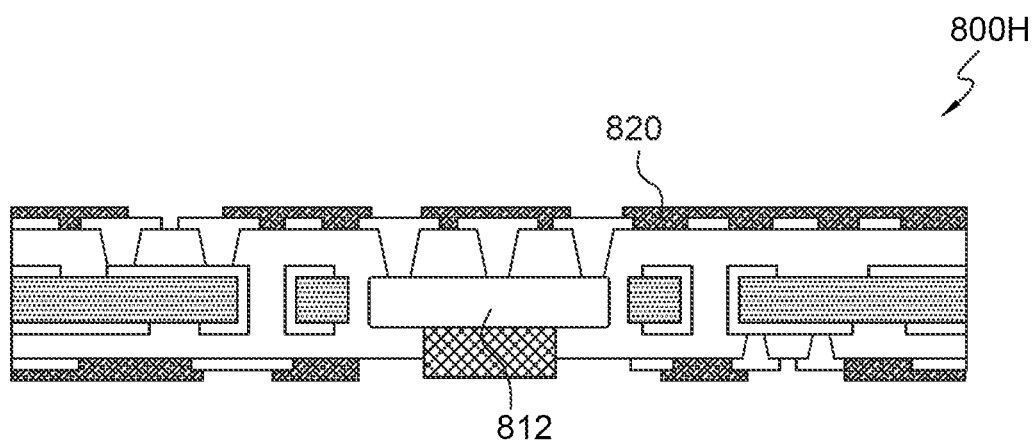
Figure 8I:
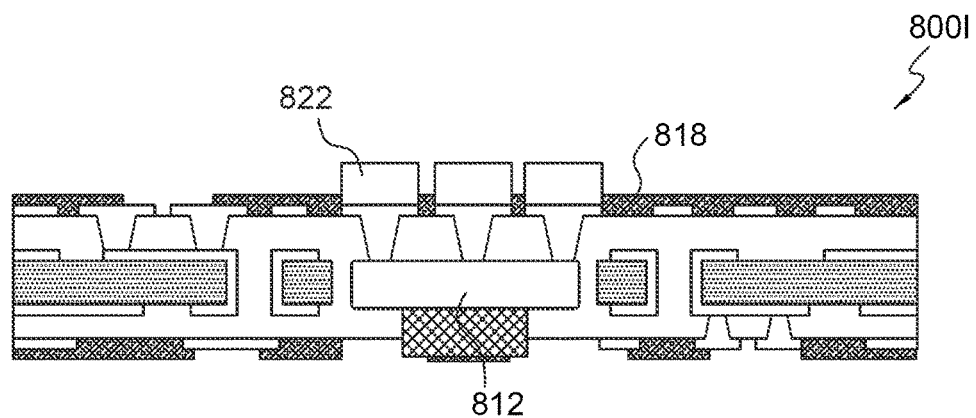
Figure 8J:
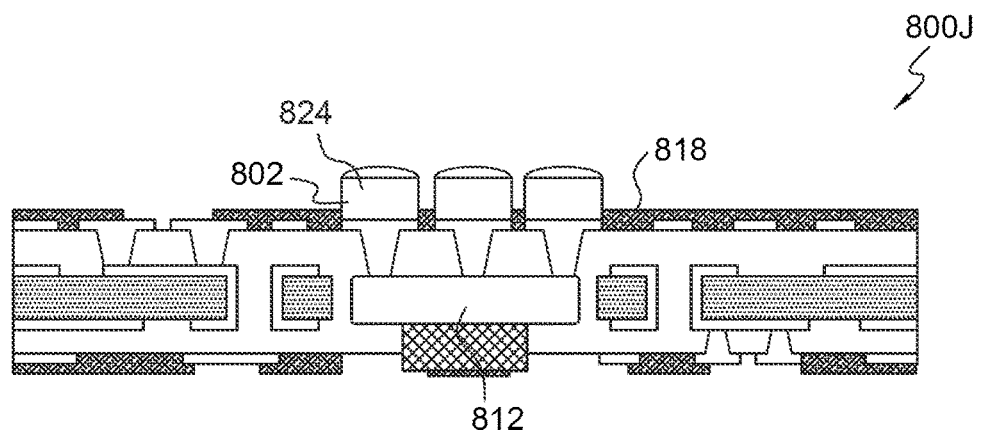
Figure 8K:
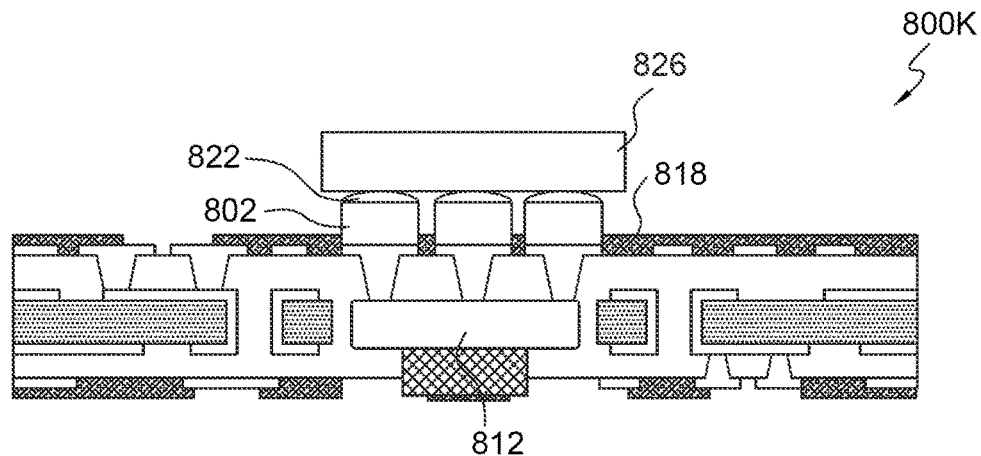

FIGS. 8H, 8I, 8J, and 8K are diagrams of examples 800H, 800I, 800J and 800K of the panel at various additional stages in the method. In FIG. 8H, a solder mask or other passivation material 820 may be formed on certain portions of top and bottom surfaces of the dielectric material 814. In FIG. 8I, conductive pillars 822, such as copper pillars, may be formed on the conductive pads 816 of FIG. 8G. In FIG. 8J, solder material 824, such a solder bumps or balls, may be formed on the conductive pillars 822. In FIG. 8K, an LED array 826 may be placed or otherwise disposed over the solder material 822. The entire assembly 800K may be heated, and the solder material 822 may reflow, thus electrically and mechanically coupling the LED array 826 to the pillars 822. The pillars 822 may be coupled to individual LEDs or emitters in the LED array 826. Although not shown, subsequent processing steps may be performed, including forming the underfill, forming the wavelength converting structure over the LED array 826 (e.g., phosphor integration), substrate thinning or laser liftoff (e.g., thinning or removal of any growth or other temporary substrate of the LED array 826) and/or dicing the panel into multiple LED lighting systems, such as the LED lighting system 300 of FIG. 3.

In embodiments, the wavelength converting structure may be formed by electrophoretically depositing a material containing at least one phosphor material with application of a voltage. Varying an applied voltage duration may correspondingly vary an amount and thickness of the deposited material. Alternatively, the LED may be coated with the phosphor-containing material, for example using an organic binder to adhere phosphor particles to the LED array. Phosphor-containing materials may be dispensed, screen printed, sprayed, molded or laminated. Alternatively, for certain applications. Glass containing at least one phosphor material and/or a pre-formed sintered ceramic containing a phosphor material maybe coupled to the LED array.

While the Figures described above show the thermally conductive material, the LED array and the backplane having certain relative sizes, one of ordinary skill in the art will recognize that the sizes of these elements may vary. For example, the backplane may be larger or smaller than the corresponding LED array, and the thermally conductive material may be larger or smaller than the backplane. The sizes of each of these elements may depend, for example, on performance and cost optimization.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A panel of light-emitting diode (LED) arrays, the panel comprising:
    a substrate having a top surface and a bottom surface;
    a plurality of backplanes embedded in the substrate, each of the plurality of backplanes having a top surface and a bottom surface;
    a plurality of arrays of first electrically conductive structures extending at least from the top surface of each of the plurality of backplanes to the top surface of the substrate;
    a plurality of LED arrays, each electrically coupled to one of the plurality of arrays of first electrically conductive structures;
    a plurality of second electrically conductive structures extending from each of the plurality of backplanes to at least the bottom surface of the substrate, at least some of the second electrically conductive structures electrically coupled to at least one of the plurality of LED arrays; and
    a plurality of thermal conductors, at least one of the plurality of thermal conductors in contact with the bottom surface of one of the plurality of backplanes and extending to at least the bottom surface of the substrate.

2. The panel of claim 1, wherein the plurality of backplanes comprise a non-organic material.

3. The panel of claim 1, wherein the substrate comprises an organic material.

4. The panel of claim 1, wherein the plurality of arrays of first electrically conductive structures comprise a plurality of arrays of metal pillars.

5. The panel of claim 1, wherein the plurality of arrays of first electrically conductive structures extend above the top surface of the substrate.

6. The panel of claim 1, wherein the plurality of second electrically conductive structures at least partially comprise conductive vias in the substrate.

7. The panel of claim 6, wherein the plurality of second electrically conductive structures further comprise surface traces on the backplane that are electrically coupled to the conductive vias in the substrate.

8. The panel of claim 6, wherein the substrate comprises at least one layer of dielectric material, and the conductive vias are formed in the at least one layer of dielectric material.

9. The panel of claim 1, wherein the plurality of LED arrays are monolithic LED arrays, each comprising a plurality of emitters, each of the plurality of emitters having a width of 100 µm or less and arranged in rows and columns with lanes between adjacent rows and columns having a width of 20 µm or less.

10. A light-emitting diode (LED) lighting system comprising:
    a substrate portion having a top surface and a bottom surface;
    a backplane embedded in the substrate portion, the backplane having a top surface and a bottom surface;
    an array of first electrically conductive structures extending at least from the top surface of the backplane to the top surface of the substrate portion;
    an LED array electrically coupled to the array of first electrically conductive structures;
    a plurality of second electrically conductive structures extending from the backplane to at least the bottom surface of the substrate, at least some of the second electrically conductive structures electrically coupled to the array of first electrically conductive structures via the backplane; and
    a thermal conductor in contact with the bottom surface of the backplane and extending to at least the bottom surface of the substrate.

11. The system of claim 10, wherein the backplane comprises a non-organic material.

12. The system of claim 10, wherein the substrate comprises an organic material.

13. The system of claim 10, wherein the array of first electrically conductive structures comprises an array of metal pillars.

14. The system of claim 10, wherein the array of first electrically conductive structures extend above the top surface of the substrate.

15. The system of claim 10, wherein the plurality of second electrically conductive structures at least partially comprise conductive vias in the substrate.

16. The system of claim 15, wherein the plurality of second electrical conductors further comprise surface traces on the backplane that are electrically coupled to the conductive vias in the substrate.

17. The system of claim 15, wherein the plurality of second electrically conductive structures further comprise surface traces on the backplane that are electrically coupled to the conductive vias in the substrate.

18. The system of claim 15, wherein the substrate comprises at least one layer of dielectric material, and the conductive vias are formed in the at least one layer of dielectric material.

19. The system of claim 10, wherein the LED array is a monolithic LED array.

20. The system of claim 19, wherein the monolithic LED array comprises a plurality of emitters, each of the plurality of emitters having a width of 100 µm or less and arranged in rows and columns with lanes between adjacent rows and columns having a width of 20 µm or less.

* * * * *